United States Patent [19]

Werther

[11] Patent Number: 5,791,552

[45] Date of Patent: Aug. 11, 1998

[54] ASSEMBLY INCLUDING FINE-PITCH SOLDER BUMPING AND METHOD OF FORMING

[76] Inventor: William E. Werther, 228-B Country Club Dr., Simi Valley, Calif. 93065

[21] Appl. No.: 448,757

[22] Filed: May 24, 1995

[51] Int. Cl.⁶ ............................................. H05K 3/34
[52] U.S. Cl. ........................... 228/248.1; 228/180.22
[58] Field of Search ........................ 228/180.22, 254, 228/246, 563, 248.1

[56] References Cited

U.S. PATENT DOCUMENTS

| | | | |
|---|---|---|---|
| 4,705,205 | 11/1987 | Allen et al. | 228/180.22 |
| 4,712,721 | 12/1987 | Noel et al. | 228/56.3 |
| 4,788,767 | 12/1988 | Desai et al. | 228/56.3 |
| 4,842,184 | 6/1989 | Miller, Jr. | 228/56.3 |
| 5,129,573 | 7/1992 | Duffey | 228/248.1 |
| 5,299,730 | 4/1994 | Pasch et al. | 228/56.3 |
| 5,439,164 | 8/1995 | Hasegawa et al. | 228/248.1 |
| 5,492,266 | 2/1996 | Hoebener et al. | 228/248.1 |

*Primary Examiner*—Samuel M. Heinrich

[57] ABSTRACT

A method of solder bumping is provided which consists of: (1) applying a mask to a first substrate, (2) forming a well within the mask around a pad on the first substrate, (3) placing the solder within the well to from a depression, (4) mating a solder bump located on a second substrate with a solder depression in the well, and (5) reflowing the solder to form a pillar which interconnects the first and second substrates. Furthermore, the method may include the step of removing the mask.

18 Claims, 1 Drawing Sheet

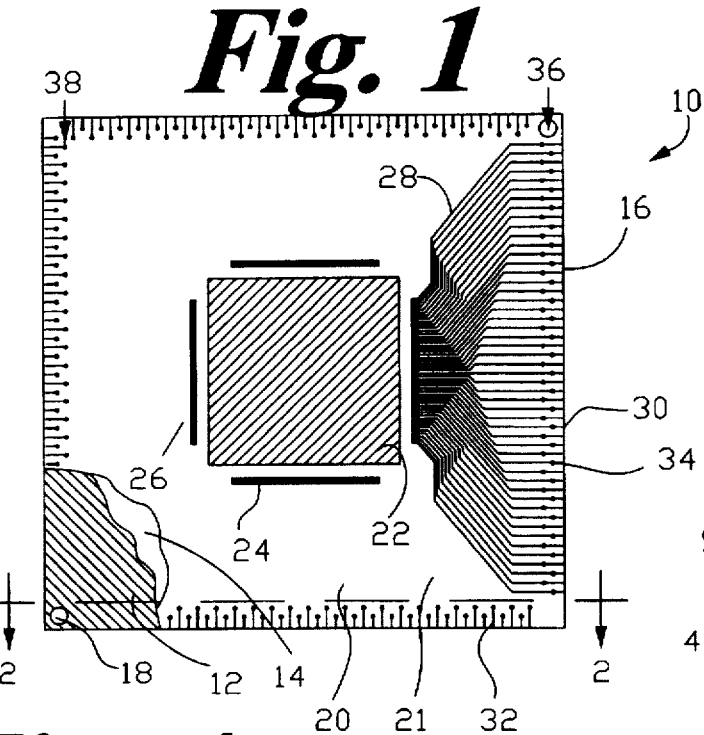
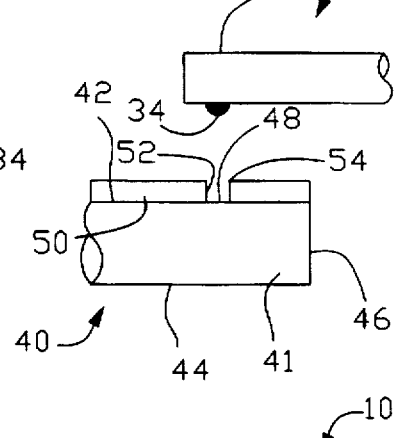
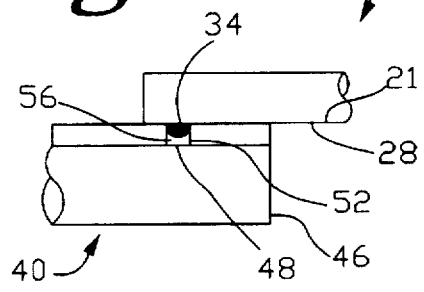
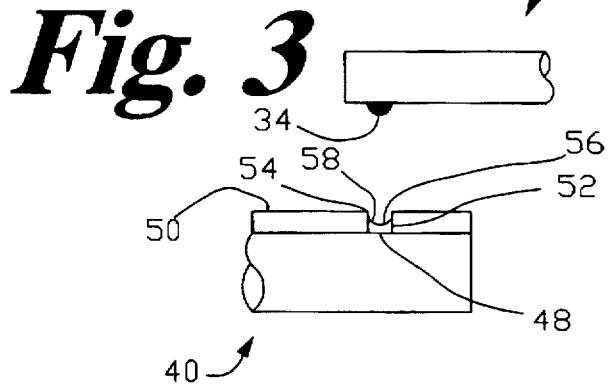
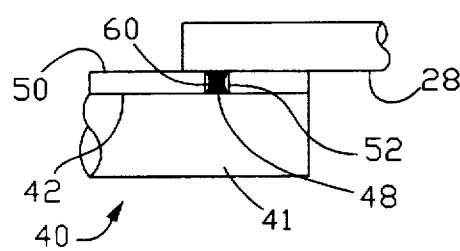
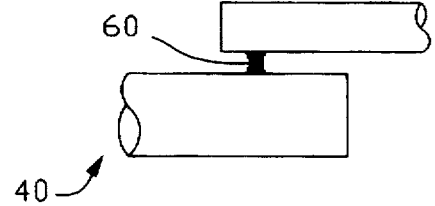

1

ASSEMBLY INCLUDING FINE-PITCH SOLDER BUMPING AND METHOD OF FORMING

BACKGROUND OF THE INVENTION

This invention pertains to a process for solder bumping, and in particular to a fine-pitch solder bumping process which is novel in positioning a solder bump onto a substrate and in maintaining a uniform solder bump size, shape, and height.

Commonly, a high density integrated circuit (chip(s)) is positioned onto a small substrate. Located on the substrate are electrically conductive traces which are attached to the integrated chip inputs and outputs. The traces on the substrate are electrically interconnected, via solder joints, to another group of traces on a second, and larger, substrate. One common process of interconnecting the traces together is known as solder bumping.

Once the two substrates are bonded together, the large substrate is attached to a circuit card assembly connector or other similar structure. Correspondingly, one of the primary purposes of the large substrate is to provide an interface between the small substrate and the circuit card connector.

In response to the demand for miniaturized electronics, there is a related demand for a reduction in the size of the substrates described above. However, forming an interconnection between such miniaturized substrates results in many difficulties.

One problem with solder bumping miniaturized substrates is the difficultly in properly aligning the traces between both substrates. Although high precision equipment is capable of aligning the traces between the two substrates, such equipment is complex an expensive.

Another general problem with solder bumping occurs when the two substrates have different thermal coefficients which causes the solder connections between the substrates to be flexed to a point of failure. The prior art has addressed this problem by: (1) ensuring that both substrates have closely matched coefficients of thermal expansion, (2) keeping the substrates small so that expansion will be minimal, and/or (3) keeping the pitch between the interconnections large so that stouter solder connections can be used to interconnect the substrates. The prior attempts to limit the effects of thermal stress all result in critical design limitations on both substrates. In addition, none of the prior art solutions facilitate the packing of more electrical circuitry within a smaller area.

Furthermore, prior solder bumping methods fail to effectively maintain any uniformity in the size, shape, and height of the solder interconnections between the two substrates. Therefore, the pitch (i.e., spacing) between the interconnections must be kept large in order to account for the wide variations in the size of solder bumps to interconnect the substrates. In addition, an even distribution of thermal expansion stress was not maintained between the solder bumps due to the different size, shape, and height of the solder interconnections.

In view of the above, it is an object of the present invention to provide an effective solder bumping technique for connecting together two substrates.

Still further, it is an object of the present invention to provide a solder bumping process with a fine pitch.

In addition, it is an-object of the present invention to provide a simple mechanical positioning in order to align the traces of two substrates prior to solder bumping.

It is also an object of the present invention to provide uniformity in the size, shape, and height of all solder bump interconnections.

Moreover, it is an object of the present invention to provide an effective interconnection between two substrates which have different coefficients of thermal expansion.

Furthermore, other objects, features, and advantages of the present invention will be apparent from the following detailed description taken in connection with the accompanying drawings.

SUMMARY OF THE INVENTION

In one form of the invention, a method is provided for solder bumping. In the method a mask is applied to a first substrate. Furthermore, a second substrate is positioned in registration with the first substrate. Finally, solder is reflowed so that an interconnection is formed between the first and second substrates.

In an embodiment, the invention further provides the step of forming a well within the mask. The well may be formed around a pad on the first substrate and have solder placed therein.

In another embodiment, the positioning of the second substrate may be accomplished by mating a solder bump on the well on the first substrate. Furthermore, the solder placed within the well may form a depression which the solder bump can be mated to.

In a further embodiment, two additional steps are provided for: removing the mask from the first substrate and attaching the interconnected substrates to a circuit card.

In another form of the invention, a method of solder bumping is provided which consists of masking a first substrate and reflowing solder to form a pillar which interconnects the first substrate with a second substrate.

In another embodiment of the invention, an additional step is provided which consists of forming a well within the mask. The well may have solder placed within it and be used to facilitate the mating of a solder bump to the first substrate. Correspondingly, the well may be formed around a pad on the first substrate.

In a further embodiment, three additional steps are provided for: (1) positioning the second substrate in registration with the first substrate, (2) removing the mask, and (3) attaching the interconnected substrates to a circuit card.

In another form of the invention, a method of solder bumping is provided which consists of: (1) applying a mask to a first substrate, (2) forming a well within the mask around a pad on the first substrate, (3) placing the solder within the well to from a depression, (4) mating a solder bump located on a second substrate with a solder depression in the well, and (5) reflowing the solder to form a pillar which interconnects the first and second substrates. Furthermore, the method may include the step of removing the mask by, for example, washing it away.

In yet another form of the invention, an integrated circuit assembly is provided which consists of a first substrate, a second substrate having an array of interconnect bumps, and a pillar interconnecting the first and second substrate wherein the pillar is formed from a mask.

In another embodiment, the invention provides for the mask layer to be removable and/or the mask to be positioned between the first substrate and the second substrate with wells for receiving the interconnect bumps.

Various means for practicing the invention and other advantages and novel features thereof will be apparent from

3 the following detailed description of an illustrative preferred embodiment of the invention.

BRIEF DESCRIPTION OF THE DRAWINGS

There is shown in the drawings a presently preferred embodiment of the present invention, wherein like numerals in the various figures pertain to like elements and wherein:

FIG. 1 is an enlarged fragmentary plan view of a conventional carrier assembly with only part of the traces depicted;

FIG. 2 is a further enlarged cross-sectional side view of the carrier assembly of FIG. 1, taken along line 2—2, and of a daughter board assembly having a mask disposed thereon;

FIG. 3 is a cross-sectional side view of the carrier and daughter board assembly of FIG. 2 with printed solder paste in the well of the mask;

FIG. 4 is a cross-sectional side view of the carrier and daughter board assembly of FIG. 3 with the carrier in register with the daughter board;

FIG. 5 is a cross-sectional side view of the carrier and daughter board assembly of FIG. 4 with the solder having been reflowed to form a solder pillar; and FIG. 6 is a cross-sectional side view of the electrical connector assembly of FIG. 5 with the mask between the carrier and the daughter board removed.

DETAILED DESCRIPTION OF THE PRESENTLY PREFERRED EMBODIMENTS

Referring to the drawings, and particularly to FIG. 1, an enlarged fragmentary plan view of a conventional carrier assembly 10 is partially depicted. The carrier assembly 10 has a rectangular substrate 12 with a front surface 14 and an opposite back surface 16. The substrate 12 can have variable dimensions. However, in the preferred embodiment used to describe the invention, the substrate 12 has a width of one (1) inch and a length of one (1) inch.

The primary function of the substrate 12 is to provide a mounting surface for an integrated circuit (chip) on the substrate's front surface 14 (integrated chip not shown). As commonly known in the art, the substrate 12 can be made of metal, Fiberglass, or some other material. Furthermore, the substrate may have registration holes 18 to facilitate alignment of a probe fixture for electrical testing of the carrier assembly components.

It is also common for the carrier substrate 12 to operate as a heat sink. Thus, it is preferable that the carrier substrate 12 be made of a metal such as aluminum so that heat is readily dissipated. However, in an alternative embodiment, if the substrate 12 is made of Fiberglass, then thermal vias are provided between the center of the carrier front surface 14 and the carrier back surface 16 (vias not shown). The thermal vias consist of thermal conductors, such as copper, which connect to a metal heat sink located on the back surface 16 of the Fiberglass substrate.

Attached to the front 14 of the substrate 12 is an active layer 20. The active layer 20 is attached to the substrate 12 by conventional means. In the preferred embodiment, the active layer 20 consists of an insulative material such as polyamide or epoxy which electrically isolates the exposed surface 21 of the active layer from the metal substrate 12. Conversely, if the substrate 12 is alternatively constructed of Fiberglass, then the active layer 20 would consist of a conductive material such as copper.

Within the center of the active layer 20 is a rectangularly shaped chip attach pad 22. Surrounding the four sides of the chip attach pad 22 are bond pads 24. The bond pads 24 are arranged in rows 26 which parallel each side of the chip attach pad 22. Each pad 24 is electrical isolated and provides a mounting surface for bonding one end of a wire to the pad (wire not shown). Correspondingly, the opposite end of each wire is connected to one of the inputs or outputs of the integrated chip so that electrical signals can be transmitted from the integrated chip to the pads.

In the preferred embodiment, the integrated chip has a size of 0.4254 inches by 0.4257 inches with 232 inputs and outputs; although it should be understood that other chip types can be used. Correspondingly, each bond pad row 26 has fifty-eight bond pads 24 for a total number of 232 pads.

Conductively connected to each pad 24 is a conductive trace 28. In the preferred embodiment, each trace 28 is made of a metallic material such as copper which is bonded to the active layer 20. However, in an alternative embodiment, the traces 28 may be etched from the active layer 20 if the carrier substrate 12 is made of an insulative material and, conversely, the active layer is made of a conductor. Selected bond pads 24 may be routed directly to a power or ground layer on the substrate, if such a layer is available.

Each trace 28 extends to the edge 30 of the carrier substrate 12 and connects to a conductive trace 32. The conductive traces 32 are constructed using a conventional technique which shorts all of the conductive traces together in order to facilitate plating. After the conductive traces 32 are plated, they are separated from each other. Preferably, each conductive trace 32 is plated with nickel and then with gold.

Located on each conductive trace 32 is at least one solder bump 34. While solder is used in the preferred embodiment, any interconnect material may be used including conductive inks. In the preferred embodiment, the solder bumps 34 are made of a mixture generally consisting of ninety percent tin and ten percent lead. The solder bumps 34 are positioned along the edge 30 of the carrier assembly 10 so that they form two rows 36,38. The first row 36 of solder bumps 34 is adjacent to the edge 30 of the carrier assembly 10. Conversely, the second row 38 of solder bumps 34 is located further from the edge 30 of the carrier assembly 10 than the first solder bump row 36.

In the preferred embodiment, the pitch between the center of the solder bumps 34 in the first row 36 is 0.020 inches. Likewise, the pitch between the center of the solder bumps 34 in the second row 38 is 0.020 inches. Furthermore, the bumps 34 in the second row 38 are aligned in between the bumps in the first row 36 which results in an interstitial bump pattern that allows for an increased bump density.

As indicated above, the carrier assembly 10 is mounted to a daughter board assembly. Referring to FIG. 2, a further enlarged cross-sectional side view of the carrier assembly 10 of FIG. 1 is depicted, taken along line 2—2, along with a daughterboard assembly 40.

Conventionally, the daughterboard assembly 40 has a substrate 41 made of insulative material such as Fiberglass or an epoxy laminate of Fiberglass. The daughterboard substrate 41 is rectangular in shape with a top surface 42, an opposite bottom surface 44, and a rectangular aperture 46 in its center. The daughterboard assembly 40 also has pads 48 on its top surface 42. As indicated previously, the pads 48 are to be conductively attached to the solder bumps 34 on the corresponding carrier assembly 10. The daughterboard may be any type of electrical connector such as a pin grid array (PGA), quad flat pack (QFP), or ball grid array (BGA).

Extending from each of the daughterboard pads 48 is a conductive trace (trace not shown). In a preferred embodiment, each daughterboard trace extends to a pin (pin not shown). Correspondingly, each pin extends perpendicularly from the bottom surface 44 of the daughterboard substrate 41 and is used to form a connection with a socket connector on a circuit card or other similar structure. Therefore, a conductive interconnection is provided from the circuit board, to the daughterboard assembly 40, and finally to the integrated chip mounted on the carrier assembly 10.

It should be noted that the above description applies to a conventionally constructed daughterboard and carrier assembly. Thus, a more detailed description is neither provided nor required for an understanding of the invention as further described below.

Continuing with FIG. 2, the carrier assembly solder bump 34 is shown positioned over one of the daughterboard pads 48. In a preferred embodiment, the pads 48 are solder, however any conductive interconnect material may be used. Extending around the solder pad 48 on the top surface 42 of the daughterboard substrate 41 is a mask 50. The mask 50 is mounted to the daughterboard substrate 41 by a conventional means and has a uniform thickness.

In a preferred embodiment, the mask 50 is permanently mounted to the daughterboard substrate 41 and thus consists of either a solder mask or a photo-image epoxy. However, in an alternative embodiment, the mask 50 can be temporarily mounted to the daughterboard substrate 41 and thus consists of a photo-resist.

Within the mask 50 are wells 52 which surround each daughterboard pad 48. In the preferred embodiment, each well 52 is cylindrical in shape and allows unobscured access to the daughterboard solder pad 48 via a well mouth 54. However, the shape of the well 52 need not be cylindrical in shape and thus it may be desirable to have a non-cylindrical shape. Each well 2 is formed when the mask 50 is mounted onto the daughterboard 40 by a conventional process corresponding to the type of mask material used. For example, the mask 50 can be mounted to the daughterboard 40 by screen printing, and the well 52 formed by lamination, or vacuum lamination. In the preferred embodiment, each well 52 has a diameter of 0.010 inches and a height of 0.010 inches.

In the preferred embodiment, before the carrier assembly 10 is placed in register with the daughterboard assembly 40, solder paste 56 is printed on the mask 50 as shown in FIG. 3. The solder paste 56 is applied by a conventional means such as screening or stencil printing and generally consists of sixty percent lead and forty percent tin.

When the solder paste 56 is applied to the daughterboard, the solder will occupy most of the well 52 but will still provide a depression 58 around the mouth 54 of the well. The depression 58 in the mask well 52 provides a seat for properly positioning the carrier solder bump 34 over the corresponding daughterboard solder pad 48. Therefore, a simple mechanically placement is provided for placing the carrier assembly 10 in register with the daughterboard assembly 40 by simply placing the solder bumps 34 within the well depressions 58.

Referring to FIG. 4, the carrier solder bump 34 is shown mated into the mask well 52 so that the carrier assembly 10 is in registration with the daughterboard assembly 40. Furthermore, the solder 56 within the well 52 is in contact with both the solder bump 34 and the daughterboard solder pad 48. The carrier assembly 10 in this mated state has a chip (not shown) attached to its exposed surface 21 and is received by rectangular aperture 46 of the daughterboard assembly 40.

Once all of the carrier solder bumps 34 are located in their respective wells 52, the solder within the well is reflowed by exposing the carrier 10 and daughterboard 40 to heat such as by placing into a solder reflow oven. As a result of the solder reflow, the solder within the well 52 will form a pillar 60 as shown in FIG. 5. The pillar 60 will place the carrier trace 28 and the daughterboard pad 48 in continuous electrical contact. Furthermore, the mask 50 will prevent the solder within each well 52 from spreading to other daughterboard pads 48 and thus a fine pitch between the substrate interconnections can be maintained.

As indicated above, in the preferred embodiment, each carrier solder bump 34 is generally comprised of ninety percent tin and ten percent lead. Likewise, the solder 56 within each well 52 is generally comprised of sixty percent lead and forty percent tin. As a result of the solder 56 in the well 52 having a greater percentage of lead than each solder bump 34, the temperature of the solder reflow oven can be set to cause the eutectic solder 56 in the well 52 to form the pillar 60 without reflow of the higher temperature solder bump 34.

As a result of using a well 52 to form each solder pillar 60, the reflow and the amount of solder 56 within the well can be controlled. Therefore, all of the pillars 60 used to form an interconnection between the carrier 10 and the daughterboard 40 will generally have a uniform size, shape, and height.

Correspondingly, the uniformity in the size, shape, and height of all the pillars 60 used to interconnect the carrier 10 and the daughterboard 40 will provide compliance between the carrier and the daughterboard. The compliance is provided by the uniformity in the pillars 60 and their 'aspect ratio' (ratio of height to diameter of the pillar). Thus, the pillars 60 will equally distribute the stress caused by the irregular rates of thermal expansion between the two substrates. Furthermore, all pillars 60 will uniformly deflect during the thermal expansion of the substrates.

If the mask 50 is made of a non-conductive material, then it may remain on the top surface 42 of the daughterboard substrate 41. However, it may be advantageous to remove the mask 50 if its coefficient of thermal expansion differs substantially from both the carrier 10 and the daughterboard 40 and thus the solder pillar 60 would be damaged due to expansion of the mask. Therefore, as indicated above, the mask 50 may be made of a removable material such as photo-resist.

In a preferred embodiment, the photo-resist mask 50 may be removed by simply washing it away with water. Once the mask 50 is removed, the solder pillar connection 60 between the carrier 10 and the daughterboard 40 will remain as shown in FIG. 6.

It should be understood that various changes and modifications to the presently preferred embodiments described herein will be apparent to those skilled in the art. Therefore, changes and modifications may be made without departing from the spirit and scope of the present invention and without diminishing its attendant advantages. For example, the above method may be used for interconnecting the carrier assembly directly to a circuit board assembly which is configured to be solder bumped with the carrier. Thus, it is intended that such changes and modifications be covered by the appended claims.

I claim:

1. A method of attaching a chip carrying assembly to a daughter board assembly, the method comprising the steps of:

providing a first substrate for mounting an integrated circuit chip thereon, the integrated circuit chip having a plurality of input and output contacts;

forming an array of isolated bond pads on a first surface of the first substrate;

bonding individual conductors between the bonding pads and the integrated circuit input and output contacts;

forming conductive traces on the first surface of the first substrate, the conductive traces extending from the bond pads to an edge of the first substrate;

forming solder bumps on each conductive trace, the solder bumps being positioned in two rows along the edge of the first substrate, a first row of solder bumps closest to the edge of the first substrate including those solder bumps formed on every other alternate conductive trace, and a second row behind the first row including those solder bumps formed on every other conductive trace not included in the first row;

providing a second substrate having a first surface with an array of solder pads formed thereon, the position of the solder pads corresponding to the position of the solder bumps formed on the first substrate;

placing a mask in registration over the first surface of the second substrate, the mask having a plurality of wells aligning with the solder pads formed on the second substrate;

applying solder paste to the mask such that the solder paste occupies the plurality of wells;

positioning the first substrate over the second substrate; and reflowing the solder paste to form a continuous electrical contact between the solder bumps formed on the first surface of the first substrate and the solder pads formed on the first surface of the second substrate.

2. The method of claim 1, wherein said wells are formed around solder pads formed on said first substrate.

3. The method of claim 2, wherein said well is cylindrical.

4. The method of claim 1, further comprising the step of placing said solder paste within said well to form a depression.

5. The method of claim 4, wherein said positioning step consists of aligning said solder bumps with said wells, such that said solder bumps are seated within said depressions.

6. The method of claim 1, wherein said reflow step forms a pillar to interconnect said first and second substrates.

7. The method of claim 1, wherein said reflow solder paste is eutectic.

8. The method of claim 1, further including the step of removing said mask.

9. The method of claim 8, wherein said removing step consists of washing away said mask.

10. The method of claim 1, further including the step of attaching said interconnected substrates to a circuit card.

11. A method of electrically connecting an integrated circuit chip to a printed circuit board comprising the steps of:

providing a chip carrier substrate;

forming a chip attach pad in the center of the substrate, the chip attach pad having an outer periphery;

forming an array of bonding pads around the periphery of the chip attach pad;

forming a plurality of conductive traces on the chip carrier substrate such that a single trace extends from each bonding pad to an edge of the chip carrier substrate;

forming at least one solder bump on each conductive trace, the solder bumps forming a fine pitched row of solder bumps along the edge of the chip carrier substrate;

mounting an integrated circuit chip to the chip attach pad;

connecting individual conductors between the bonding pads and input and output contacts located on the integrated circuit chip;

providing a second substrate for mounting to a printed circuit board;

placing a mask over a first surface of the second substrate;

placing solder paste over the mask;

placing the chip carrier substrate over the solder paste in registration with the mask;

reflowing the solder paste to form a pillar which interconnects the chip carrier substrate to the second substrate; and mounting the second substrate to a printed circuit board.

12. The method of claim 11, further comprising the step of forming a well within said mask.

13. The method of claim 12, wherein said well is cylindrical.

14. The method of claim 12, further including the step of mating a solder bump on said first substrate within said well.

15. The method of claim 12, wherein said well is formed around a pad on said first substrate.

16. The method of claim 12, further comprising the step of placing said solder within said well.

17. The method of claim 11, further including the step of removing said mask.

18. The method of claim 11, wherein said reflow solder is eutectic.

* * * * *

UNITED STATES PATENT AND TRADEMARK OFFICE
CERTIFICATE OF CORRECTION

PATENT NO.     : 5,791,552
DATED          : August 11, 1998
INVENTOR(S)    : William E. Werther It is certified that error appears in the above-identified patent and that said Letters Patent is hereby corrected as shown below:

<u>Title page,</u>
Item [73], the name of the assignee should be inserted as follows:
-- Methode Electronics, Inc. --.

Signed and Sealed this

Twenty-ninth Day of October, 2002

Attest:

Attesting Officer

JAMES E. ROGAN
*Director of the United States Patent and Trademark Office*